United States Patent [19]

Sato et al.

[11] Patent Number: 5,062,705
[45] Date of Patent: Nov. 5, 1991

[54] APPARATUS FOR EVALUATING A LENS

[75] Inventors: Takeo Sato, Kawasaki; Masaki Yamamoto, Tokyo; Shinichiro Aoki, Kawasaki; Yoshiyuki Sugiyama, Ayase; Yoshito Nakanishi; Hiroyuki Takeuchi, both of Kawasaki, all of Japan

[73] Assignee: Matsushita Electric Industrial Co., Ltd., Osaka, Japan

[21] Appl. No.: 580,752

[22] Filed: Sep. 11, 1990

[30] Foreign Application Priority Data

Sep. 13, 1989 [JP] Japan ................................ 1-237797
Oct. 19, 1989 [JP] Japan ................................ 1-272841
Oct. 19, 1989 [JP] Japan ................................ 1-272844

[51] Int. Cl.$^5$ ............................................. G01B 9/00
[52] U.S. Cl. ............................................... 356/124
[58] Field of Search ............... 356/124, 125, 126, 127; 355/53

[56] References Cited

U.S. PATENT DOCUMENTS 4,772,119  9/1988  Bouwhuis et al. ................. 356/124
4,891,663  1/1990  Hirose ............................... 355/53

OTHER PUBLICATIONS

Zimmerman, Applied Optics, vol. 2, No. 7, Jul. 1963, pp. 759–760.

Primary Examiner—F. L. Evans
Attorney, Agent, or Firm—Lowe, Price, LeBlanc & Becker

[57] ABSTRACT

A first reticle is located at an object position of a lens to be evaluated. The first reticle is formed with a first diffraction grating. A stage supports the first reticle. A coherent light source illuminates a whole region of the first diffraction grating. A spatial filter blocks a 0-order component of diffraction light from the first diffraction grating. A second reticle is located at an image position of the lens and is formed with a second diffraction grating. A stage moves the second reticle within a projection range of the lens. Interference fringes are formed on the second reticle by re-diffraction by the lens. Moire fringes are caused by the second diffraction grating and the interference fringes. The moire fringes are observed.

9 Claims, 11 Drawing Sheets

5,062,705

APPARATUS FOR EVALUATING A LENS

BACKGROUND OF THE INVENTION

This invention generally relates to an apparatus for evaluating a lens, and specifically relates to an apparatus for measuring the aberration of a lens.

Some semiconductor devices are fabricated by use of a light exposure system which projects a fine semiconductor pattern on a semiconductor wafer. Generally, lenses used in such a light exposure system are required to have a high resolving power. For example, a required resolving power is 1 micrometer or less, and corresponds to 500 lines/mm or higher in spatial frequency.

There are various prior art apparatuses for evaluating a lens. The prior art apparatuses are generally inadequate in accuracy for a high-resolution lens. Accordingly, an accurate apparatus for evaluating such a high-resolution lens has been desired.

SUMMARY OF THE INVENTION

It is an object of this invention to provide an accurate apparatus for evaluating a lens.

According to a first aspect of this invention, an apparatus for evaluating a lens comprises a first reticle located at an object position of the lens and formed with a first diffraction grating; a stage supporting the first reticle; a coherent light source illuminating a whole region of the first diffraction grating; a spatial filter blocking a 0-order component of diffraction light from the first diffraction grating; a second reticle located at an image position of the lens and formed with a second diffraction grating; a stage moving the second reticle within a projection range of the lens; and means for observing moire fringes which are caused by the second diffraction grating and interference fringes, the interference fringes being formed on the second reticle by re-diffraction by the lens.

According to a second aspect of this invention, an apparatus for evaluating a lens comprises a diffraction grating located at an object plane of the lens; means for illuminating the diffraction grating with coherent light, wherein the diffraction grating generates diffraction light from the coherent light, and the diffraction light is incident to the lens; a member located at an image plane of the lens and having a predetermined pattern, wherein the diffraction light passes through the lens and forms interference fringes on the member, and wherein moire fringes result from an overlap between the interference fringes and the predetermined pattern; and means for enabling the moire fringes to be observed.

BRIEF DESCRIPTION OF THE DRAWINGS

The like and corresponding elements are denoted by the same reference characters throughout the drawings.

DESCRIPTION OF THE FIRST PREFERRED EMBODIMENT

Figure 1:
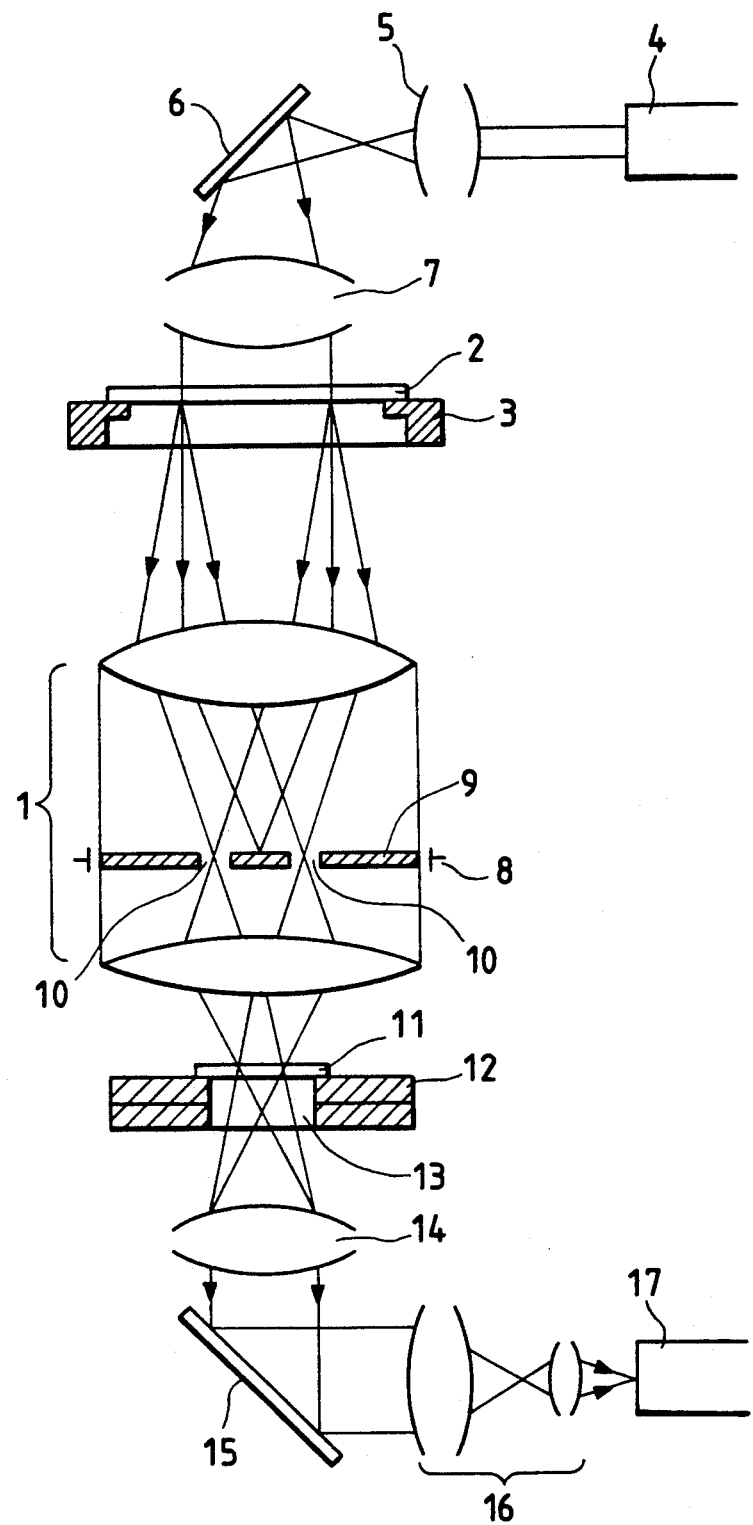
FIG. 1 a diagram of an apparatus for evaluating a lens according to a first embodiment of this invention.

With reference to FIG. 1, a projection lens unit 1 including lenses is exposed to evaluation of aberration. The projection lens unit 1 will be referred to as the projection lens 1 hereinafter. The projection lens 1 is designed so that its projection magnification, used light wavelength $\lambda$, and numerical aperture NA will be 1/5, 248 nm, and 0.355 respectively. A reticle 2 is formed with a first diffraction grating. The reticle 2 is placed on an object plane of the projection lens 1. The reticle 2 is supported on a mask stage 3 in such a manner that the reticle 2 can move in a horizontal plane. The reticle 2 is illuminated by a coherent light source 4. The wavelength of the coherent light from the source 4 is equal to the wavelength of the used light of the projection lens 1. The coherent light from the source 4 is applied to the reticle 2 via an illumination optical system including a condenser optical system 5, a light-path changing mirror 6, and a condenser lens 7.

The projection lens 1 has an entrance pupil 8. A spatial filter 9 is detachably provided on a plane (a spectrum surface) of the entrance pupil 8 of the projection lens 1. The spatial filter 9 has apertures 10 which transmit only ±1-order diffraction lights. The spatial filter 9 blocks other-order diffraction lights from the first diffraction grating on the reticle 2. A reference reticle 11 is formed with a second diffraction grating. The reference reticle 11 is placed on an image plane of the projection lens 1. The reference reticle 11 is supported on a stage 12 in such a manner that the reference reticle 11 can move in a horizontal plane and in the direction of an optical axis within a projection range of the projection lens 1. As will be explained later, moire fringes are formed on the reference reticle 11. The stage 12 has an opening 13 extending in a light exposure area of the projection lens 1.

An objective 14 and a light-path changing mirror 15 are placed below the opening 13 of the stage 12. The light-path changing mirror 15 is followed by image formation lenses 16 and an image pickup device 17. The image pickup device 17 has a sensitivity with respect to the wavelength of the light emitted from the coherent light source 4. The devices 14, 15, 16, and 17 compose an observation optical system which serves to enlarge the moire fringes on the reference reticle 11 and to enable accurate observation of the moire fringes.

Figure 2:
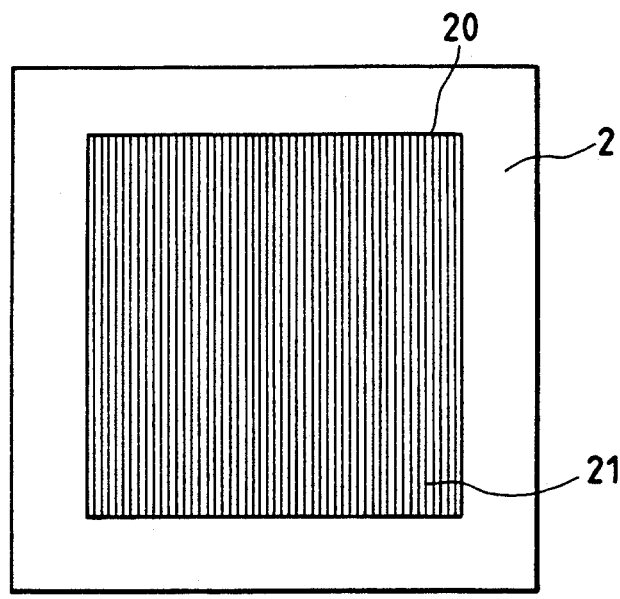
FIGS. 2 and 3 are plan view of the reticles of FIG. 1.

As shown in FIG. 2, the reticle 2 has a projection area 20 which corresponds to the projection area of the projection lens 1. Since it is preferable that the evaluation of the projection lens 1 is made over the whole of the projection area of the projection lens 1, the whole of the projection area 20 of the reticle 2 is formed with a first diffraction grating 21 including parallel straight lines spaced at equal intervals or pitches. It is preferable that the pitch P of the first diffraction grating 21 satisfies the condition "$P \geq \lambda/NA$" where "$\lambda$" denotes the wavelength of the used light of the projection lens 1 and "NA" denotes the numerical aperture of the projection lens 1. For example, the pitch P of the first diffraction grating 21 is equal to 3.5 micrometers.

Figure 3:
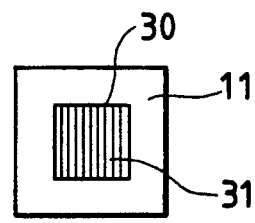

As shown in FIG. 3, the reference reticle 11 has a projection area or a light exposure area 30 which exactly corresponds to the first grating projection area 20 multiplied by the magnification of the projection lens 1, that is, 1/5. The whole of the projection area 30 of the reference reticle 11 is formed with a second diffraction grating 31 including parallel straight lines spaced at equal intervals or pitches. The pitch of the second diffraction grating 31 equals the pitch of the first diffraction grating which is multiplied by the magnification of the projection lens 1, that is, 1/5. In the case where the pitch of the first diffraction grating 21 is equal to 3.5 micrometers, the pitch of the second diffraction grating 31 is equal to 0.7 micrometers. Generally, the positional relation between the first diffraction grating 21 and the second diffraction grating 31 are chosen so that the lines of the first diffraction grating 21 are essentially parallel to the lines of the second diffraction grating 31.

Figure 4:
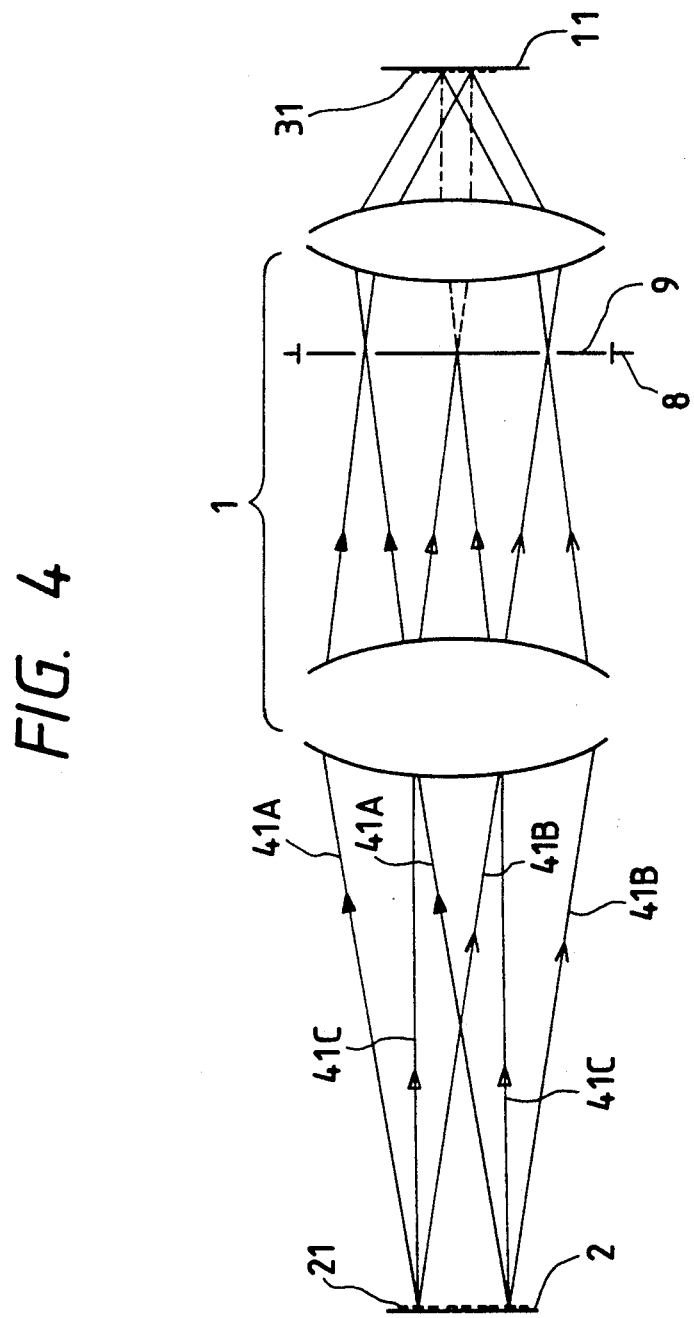
FIG. 4 is a diagram of a part of the apparatus of FIG. 1.

The light emitted from the coherent light source 4 is applied to the reticle 2 via the illumination optical system including the devices 5-7. The applied light passes through the first diffraction grating 21 on the reticle 2. As shown in FIG. 4, when the applied light passes through the first diffraction grating 21, the light is diffracted and is thus divided into various-order diffraction lights including +1-order diffraction light 41A, 0-order diffraction light 41C, and −1-order diffraction light 41B. The +1-order diffraction light 41A, the 0-order diffraction light 41C, and the −1-order diffraction light 41B are incident to the projection lens 1, and then reach the spatial filter 9 within the projection lens 1. The spatial filter 9 cuts off the 0-order diffraction light 41C but transmits the +1-order diffraction light 41A and the −1-order diffraction light 41B. After the +1-order diffraction light 41A and the −1-order diffraction light 41B pass through the spatial filter 9, they exit from the projection lens 1 and encounter the reference reticle 11. When the +1-order diffraction light 41A and the −1-order diffraction light 41B pass through the projection lens 1, they undergo diffraction again. In other words, the lights 41A and 41B are re-diffracted by the projection lens 1. As a result, the +1-order diffraction light 41A and the −1-order diffraction light 41B applied to the reference reticle 11 form interference fringes on the diffraction grating 31 of the reference reticle 11. The intensity I(x) of the interference fringes is expressed by the following known equation.

$$I(x) = b^2/2\{1 + \cos(4\pi x/p)\}$$

where "b" denotes the amplitude of the light transmitted through the first diffraction grating 21, and "p" denotes the value equal to the pitch P of the first diffraction grating 21 which is multiplied by the magnification $\beta$ of the projection lens 1. The pitch of the interference fringes is equal to a half of the pitch of an original geometrical optics image, and the contrast of the interference fringes is equal to 1. Accordingly, in the case where the pitch of the second diffraction grating 31 is equal to a half of the pitch of the original geometrical optics image which is given by "$\beta \times P$", moire fringes result from the overlap or the superimposition between the interference fringes and the lines of the second diffraction grating 31.

Figure 5:
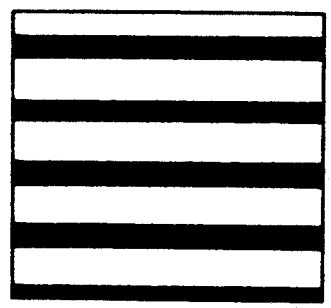
FIGS. 5 and 6 are diagrams showing moire fringes generated in the apparatus of FIG. 1.
Figure 6:
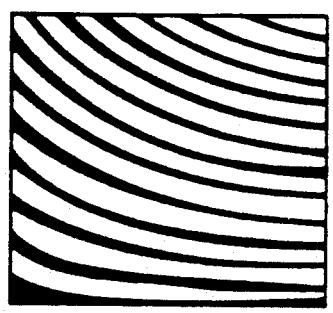

In the case where the projection lens 1 is free from aberration, the interference fringes result from the interference between the ideal plane waves of the +1-order diffraction light 41A and the −1-order diffraction light 41B so that the interference fringes are composed of parallel straight lines. Accordingly, as shown in FIG. 5, the moire fringes are also composed of parallel straight lines. In the case where the projection lens 1 has aberration, the +1-order diffraction light 41A and the −1-order diffraction light 41B differ from the ideal plane waves so that the interference fringes are curved. Accordingly, as shown in FIG. 6, the moire fringes are also composed of curved lines. The aberration of the projection lens 1 can be estimated by quantitatively measuring the curvature in the moire fringes.

In order to measure the curvature in the moire fringes, it is preferable that the pitch of the second diffraction grating 31 equals $n \times \beta \times P$ or $1/n \times \beta \times P$ where n" denotes a predetermined integer. For example, the pitch of the second diffraction grating 31 is 0.7 micrometers.

The operation will be further described hereinafter. The light emitted from the coherent light source 4 is applied to the reticle 2 via the illumination optical system including the devices 5-7. The whole of the projection area 20 of the reticle 2 is illuminated by the coherent light. Thus, diffraction light is generated from the entire area of the first diffraction grating 21. The diffraction light is incident to the projection lens 1. The incident light forms point spectrums on the entrance pupil 8 of the projection lens 1. The point spectrums correspond to the numbers of order of the diffraction respectively. The spatial filter 9 on the entrance pupil 8 has the apertures 10 for selecting and transmitting only the ±1-order components of the diffraction light. Thus, only the +1-order diffraction light 41A and the −1-order diffraction light 41B pass through the projection lens 1 while being re-diffracted by the projection lens 1. The +1-order diffraction light 41A and the −1-order diffraction light 41B which exit from the projection lens 1 interfere with each other, forming the interference fringes on the image plane of the projection lens 1. The reference reticle 11 is moved via the stage 12 into a position where an image of the first diffraction grating 21 in the projection area 20 can be normally formed through the projection lens 1. The moire fringes result from the overlap or the superimposition between the lines of the second diffraction grating 31 on the reference reticle 11 and the interference fringes by the +1-order diffraction light 41A and the −1-order diffraction light 41B. The aberration related to the whole of the light exposure area 30 can be observed by monitoring the moire fringes. The moire fringes on the reference reticle 11 are moved to a central part of the observation field of view via the observation optical system including the devices 14-17. The shape of the moire fringes can be observed through the observation optical system.

As described previously, the spatial filter 9 blocks the 0-order component but transmits the ±1-order components of the diffraction light from the reticle 2. The +1-order diffraction light and the −1-order diffraction light are re-diffracted by the projection lens 1, forming the interference fringes on the image plane of the projection lens 1. The moire fringes result from the overlap between the interference fringes and the lines of the second diffraction grating 31. Accordingly, a high spatial frequency of the re-diffraction image to be evaluated is converted into a low frequency of the moire fringes so that the aberration of the projection lens 1 can be accurately measured in a spatial frequency range equal to or below 1 micrometer.

DESCRIPTION OF THE SECOND PREFERRED EMBODIMENT

Figure 7:
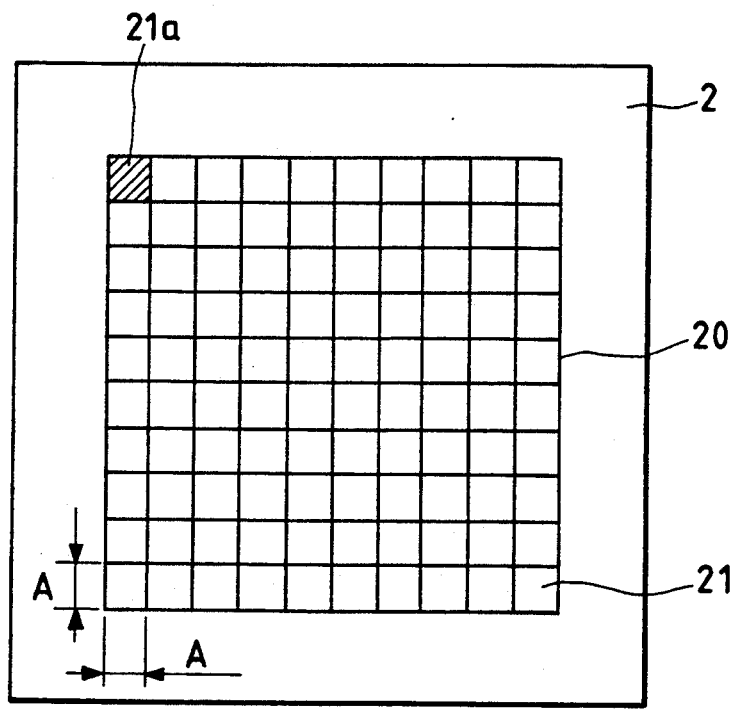
FIGS. 7 and 8 are plan views of reticles in an apparatus according to a second embodiment of this invention.
Figure 8:
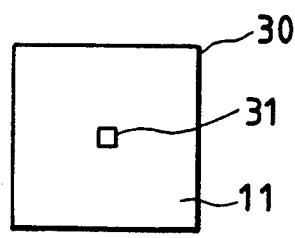

A second embodiment of this invention is similar to the embodiment of FIGS. 1-6 except for design changes described hereinafter. In the second embodiment, as shown in FIG. 7, a projection area 20 of a reticle 2 is divided into square segments having equal sizes of $A \times A$. A first diffraction grating 21 has a group of sub diffraction gratings 21a which extend in the square segments of the projection area 20 respectively. The sub gratings 21a are square and have equal sizes corresponding to $A \times A$. In the second embodiment, as shown in FIG. 8, a second diffraction grating 31 on a reference reticle 11 is square and has a size equal to one fifth of the size of a sub diffraction grating 21a. The factor "one fifth" agrees with the magnification of a projection lens 1.

A description will be given hereinafter of the operation of the second embodiment which relates to a process of evaluating the aberration of a given region of the projection lens 1. A spatial filter 9 within a projection lens 1 blocks the 0-order component 41C but transmits the ±1-order components 41A and 41B of diffraction light from the whole of the projection area 20 of the reticle 2. The +1-order diffraction light 41A and the −1-order diffraction light are diffracted again by the projection lens 1 and are directed toward the reference reticle 2, forming interference fringes in a region of an image plane of the projection lens 1 which corresponds to the whole of the projection area 20 of the reticle 2. Since only a part of the reference reticle 11 which corresponds to one sub diffraction grating 21a is formed with the second diffraction grating 31, moire fringes are formed only in a region where the interference fringes and the second diffraction grating 31 overlap. The reference reticle 11 is moved via a stage 12 into a position where an image of the sub diffraction grating 21a can be normally formed through the projection lens 1. The moire fringes result from the overlap or the superimposition between the lines of the second diffraction grating 31 on the reference reticle 11 and the interference fringes by the +1-order diffraction light 41A and the −1-order diffraction light 41B which come from the sub diffraction grating 21a. The moire fringes on the reference reticle 11 are moved to a central part of the observation field of view via an observation optical system including devices 14-17. The shape of the moire fringes can be observed through the observation optical system.

In general, the part of the interference fringes which overlaps with the second diffraction grating 31 corresponds to one of the sub diffraction gratings 21a as well as a portion of the projection lens 1. Therefore, the moire fringes which result from the overlap between the interference fringes and the second diffraction grating 31 represent the aberration of a portion of the projection lens 1. By observing the moire fringes, the aberration of a portion of the lens 1 can be evaluated. As the second diffraction grating 31 is moved relative to the interference fringes via the stage 12, the sub diffraction grating 21a corresponding to the moire fringes changes from one to another so that the evaluated portion of the projection lens 1 moves also.

DESCRIPTION OF THE THIRD PREFERRED EMBODIMENT

Figure 9:
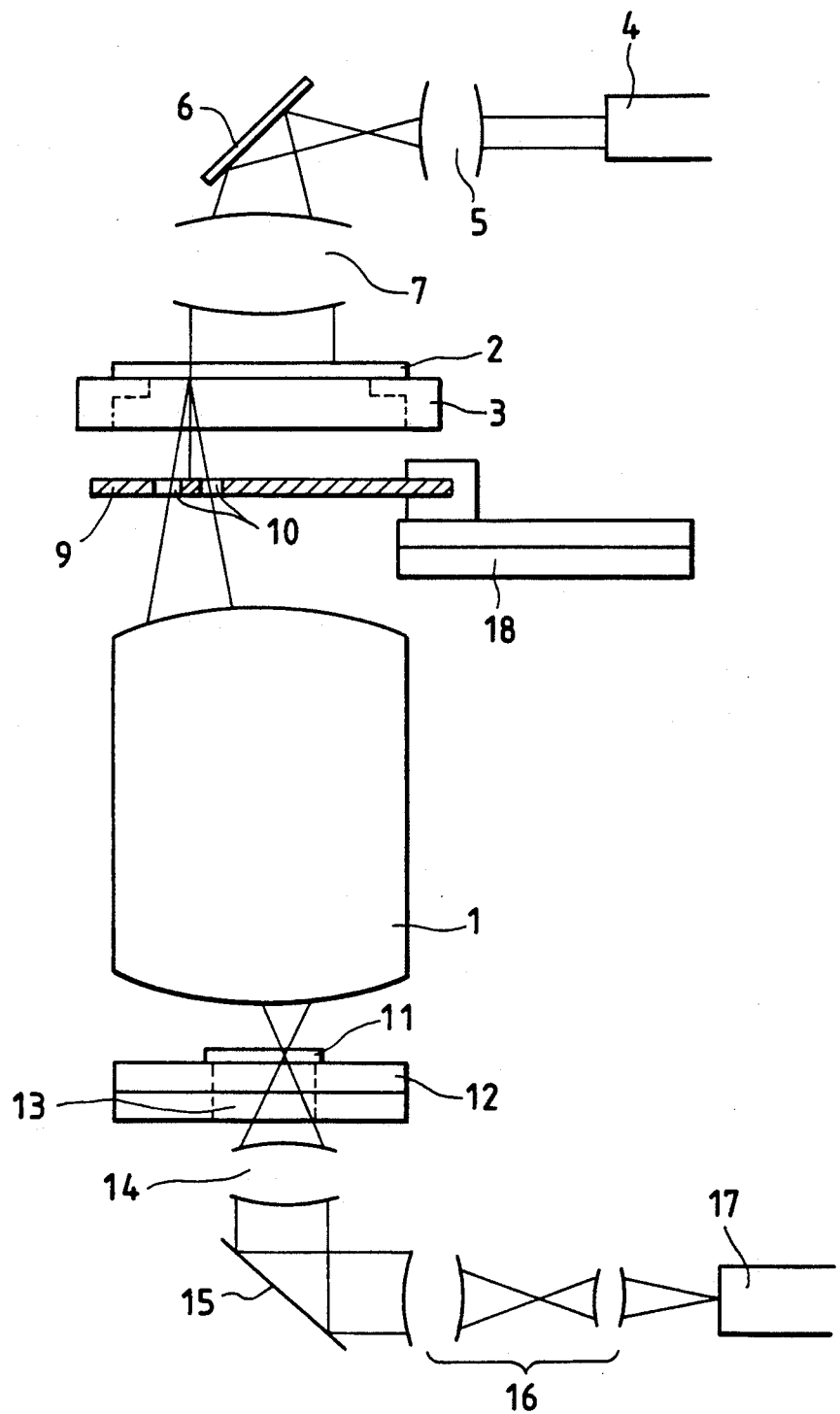
FIG. 9 is a diagram of an apparatus for evaluating a lens according to a third embodiment of this invention.

A third embodiment of this invention is similar to the embodiment of FIGS. 1-6 except for design changes described hereinafter. In the third embodiment, as shown in FIG. 9, a spatial filter 9 is disposed between a reticle 2 and a projection lens 1. The spatial filter 9 is supported on a moving device 18 in such a manner that the spatial filter 9 can move in a horizontal plane.

Figure 10:
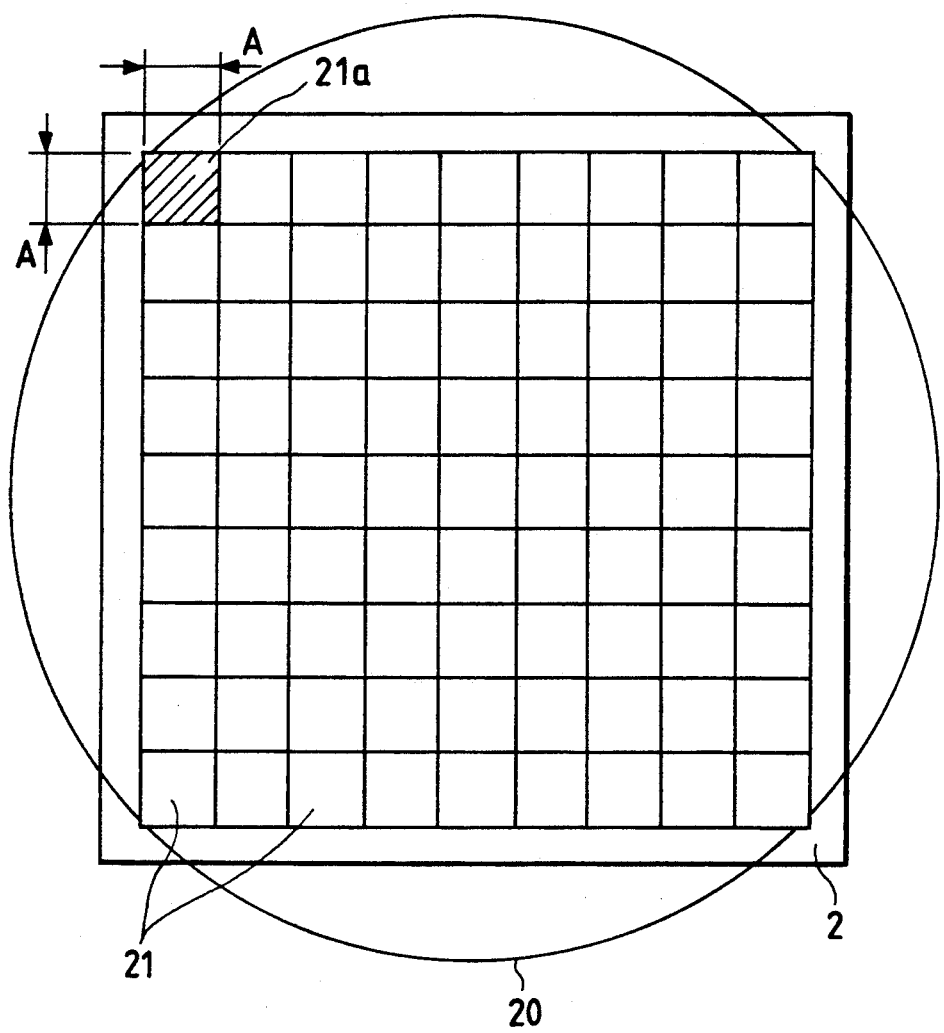
FIG. 10 is a plan view of the reticle of FIG. 9.
Figure 11:
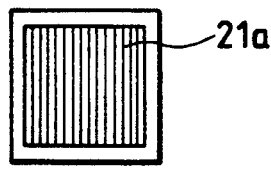
FIG. 11 is a plan view of a sub diffraction grating of FIG. 10.

In the third embodiment, as shown in FIG. 10, a projection area 20 of the reticle 2 is formed with a first diffraction grating 21 which has a group of sub diffraction gratings 21a separated in correspondence with $A \times A$ square segments. As shown in FIG. 11, each of the sub diffraction gratings 21a has parallel straight lines spaced at equal pitches of, for example, 3.5 micrometers.

In the third embodiment, as shown in FIG. 8, a second diffraction grating 31 on a reference reticle 11 is square and has a size equal to one fifth of the size of a sub diffraction grating 21a. The second diffraction grating 31 has parallel straight lines spaced at equal pitches which agree with one fifth of the pitches of the first diffraction grating 21. The factor "one fifth" agrees with a magnification of the projection lens 1. For example, the pitch of the second diffraction grating 31 equals 0.7 micrometers.

Figure 12:
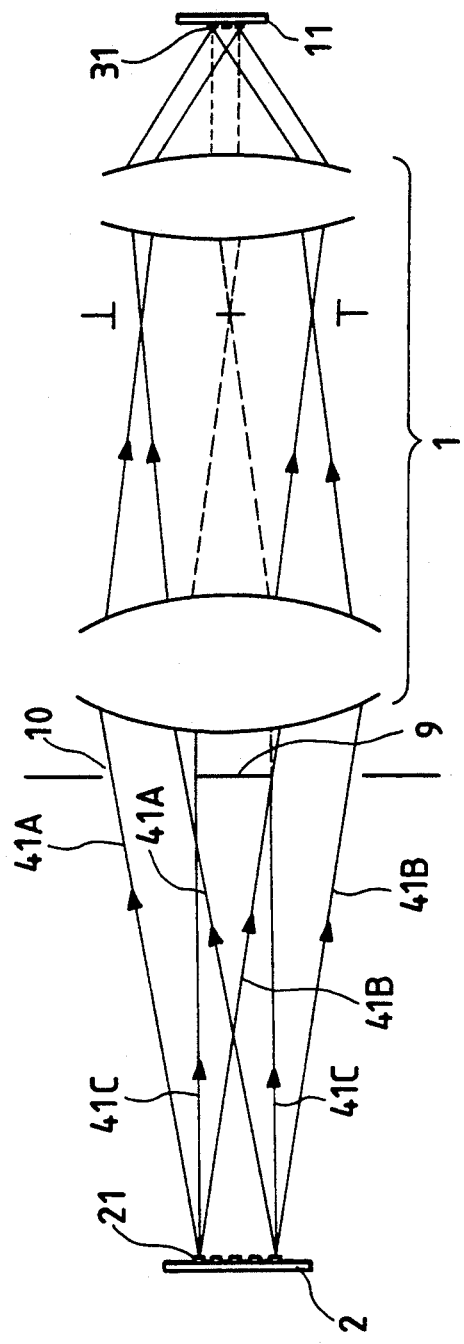
FIG. 12 is a diagram of a part of the apparatus of FIG. 9.

The third embodiment operates as follows. Light emitted from a coherent light source 4 is applied to the reticle 2. As shown in FIG. 12, the applied light passes through the reticle 2 and is diffracted by the reticle 2 into +1-order diffraction light 41A, 0-order diffraction light 41C, and −1-order diffraction light 41B. The +1-order diffraction light 41A and the −1-order diffraction light 41B are transmitted through the spatial filter 9 but the 0-order diffraction light 41C is blocked by the spatial filter 9. As a result, only the +1-order diffraction light 41A and the −1-order diffraction light 41B are incident to the projection lens 1. The +1-order diffraction light 41A and the −1-order diffraction light 41B are re-diffracted by the projection lens 1, forming interference fringes on the diffraction grating 31 of the reference reticle 11. Moire fringes result from the overlap between the interference fringes and the lines of the second diffraction grating 31. The aberration of the projection lens 1 can be estimated by quantitatively measuring a curvature in the moire fringes.

In order to measure the curvature in the moire fringes, it is preferable that the pitch of the second diffraction grating 31 equals $n \times \beta \times P$ or $1/n \times \beta \times P$ where "n" denotes an integer. For example, the pitch of the second diffraction grating 31 is 0.7 micrometers.

A description will be given hereinafter of the operation of the third embodiment which relates to a process of evaluating the aberration of a given region of the projection lens 1. The light emitted from the coherent light source 4 is applied to the reticle 2 via an illumination optical system including devices 5-7. The whole of the projection area 20 of the reticle 2 is illuminated by the coherent light. Thus, diffraction light is generated from the entire area of the first diffraction grating 21. The diffraction light is applied to the spatial filter 9. The spatial filter 9 is moved via the moving device 18 to a position where the light blocking part of the spatial filter 9 which extends between the apertures 10 is located directly below a specified one of the sub diffraction gratings 21a. The spatial filter 9 blocks the 0-order component 41C but transmits the ±1-order components 41A and 41B of the diffraction light which is generated from the specified one of the sub diffraction gratings 21a. As a result, only the +1-order diffraction light 41A and the −1-order diffraction light 41B are incident to the projection lens 1. The +1-order diffraction light 41A and the −1-order diffraction light 41B pass through the projection lens 1 while being re-diffracted by the projection lens 1. The +1-order diffraction light 41A and the −1-order diffraction light 41B which exit from the projection lens 1 interfere with each other, forming the interference fringes only on the part of the image plane of the projection lens 1 which corresponds to the specified one of the sub diffraction gratings 21a. The reference reticle 11 is moved via a stage 12 into a position where an image of the specified one of the sub diffraction gratings 21a can be normally formed through the projection lens 1. The moire fringes result from the overlap or the superimposition between the lines of the second diffraction grating 31 on the reference reticle 11 and the interference fringes by the +1-order diffraction light 41A and the −1-order diffraction light 41B which are generated by the specified one of the sub diffraction gratings 21a. Since the specified one of the sub diffraction gratings 21a corresponds to a portion of the projection lens 1, the aberration of this portion of the projection lens 1 can be evaluated by observing the moire fringes.

DESCRIPTION OF THE FOURTH PREFERRED EMBODIMENT

Figure 13:
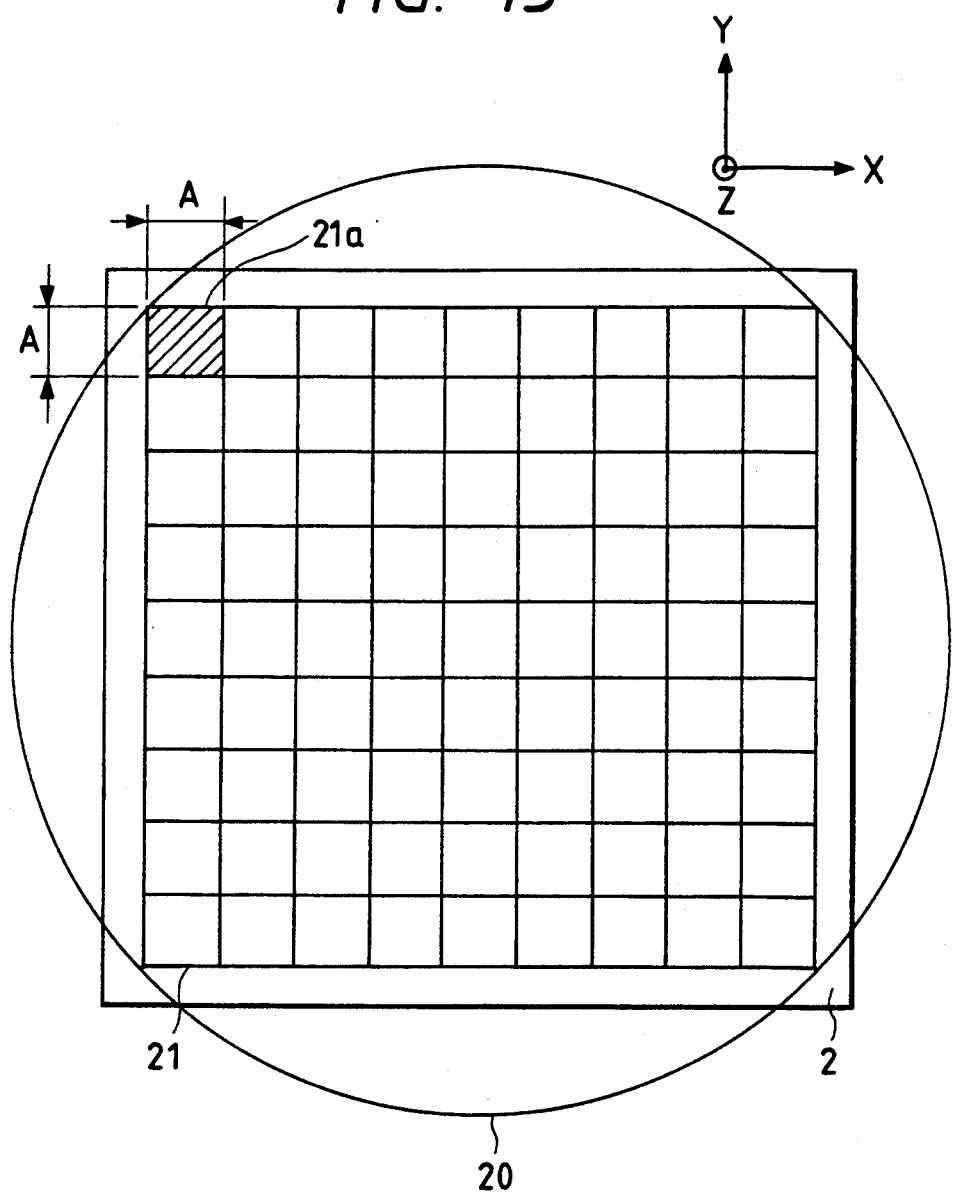
FIG. 13 is a plan view of a reticle in an apparatus according to a fourth embodiment of this invention.
Figure 14:
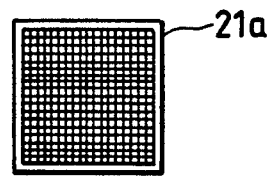
FIG. 14 is a plan view of a sub diffraction grating of FIG. 13.

A fourth embodiment of this invention is similar to the embodiment of FIGS. 9–12 except for design changes described hereinafter. In the fourth embodiment, as shown in FIG. 13, a projection area 20 of a reticle 2 is formed with a first diffraction grating 21 which has a group of sub diffraction gratings 21a separated in correspondence with A×A square segments. As shown in FIG. 14, each of the sub diffraction gratings 21a has a first set of parallel straight lines and a second set of parallel straight lines. The lines in the first set are perpendicular to the lines in the second set. The lines in the first set and the lines in the second set are spaced at equal pitches of, for example, 3.5 micrometers.

In the fourth embodiment, as shown in FIG. 8, a second diffraction grating 31 on a reference reticle 11 is square and has a size equal to one fifth of the size of a sub diffraction grating 21a. The second diffraction grating 31 has parallel straight lines spaced at equal pitches which agree with one fifth of the pitches of the first diffraction grating 21. The factor "one fifth" agrees with a magnification of the projection lens 1. For example, the pitch of the second diffraction grating 31 equals 0.7 micrometers.

Figure 15:
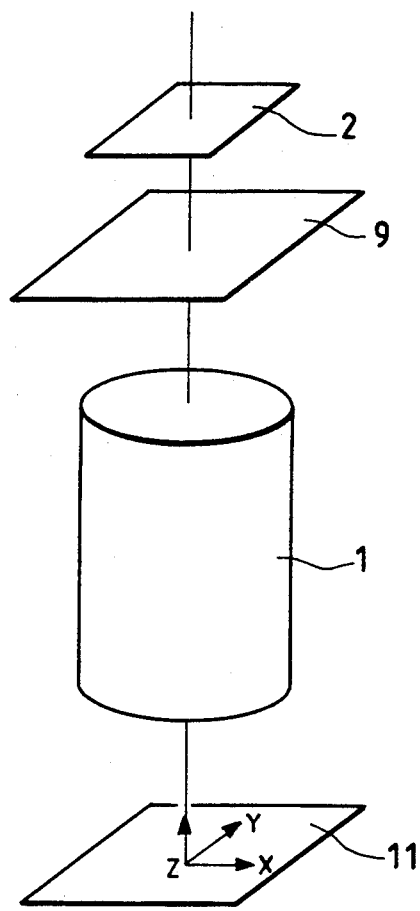
FIG. 15 is a diagram of a part of the apparatus according to the fourth embodiment.

As shown in FIG. 13 and 15, the (X, Y, Z) coordinate system is defined such that the Z axis agrees with the optical axis. In addition, the X axis is perpendicular to the first set of the lines of each sub diffraction grating 21a while the Y axis is perpendicular to the second set of the lines of each sub diffraction grating 21a.

Figure 17:
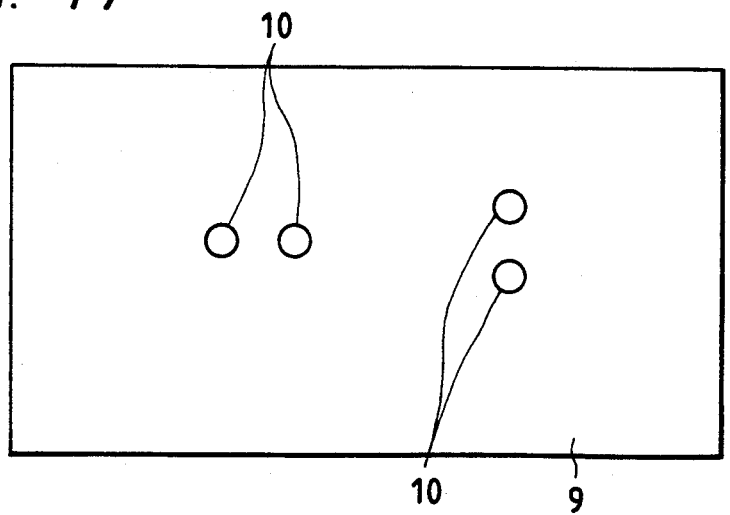
FIG. 17 is a plan view of a spatial filter in the apparatus according to the fourth embodiment.
Figure 16:
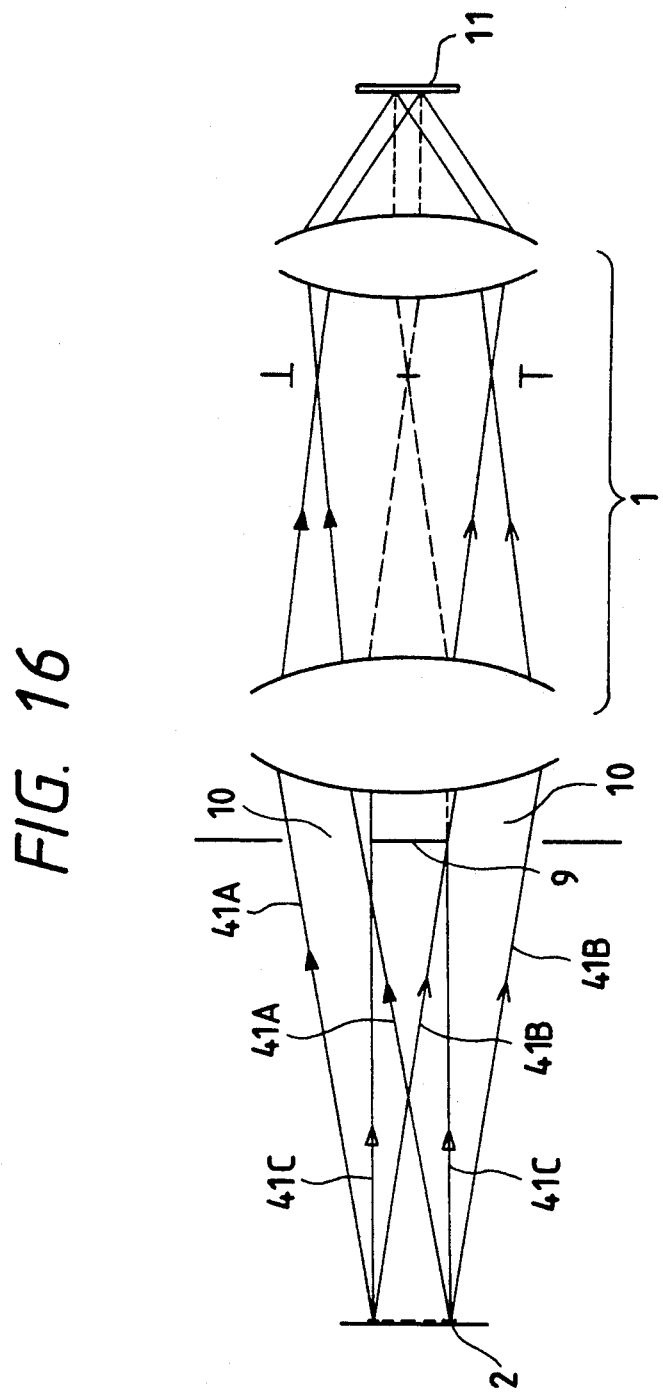
FIG. 16 is a diagram of a part of the apparatus according to the fourth embodiment.

A description will be given hereinafter of the measurement of the projection lens 1 in the meridional direction. Light emitted from a coherent light source 4 is applied to the reticle 2. As shown in FIG. 16, the applied light passes through the reticle 2 and is diffracted by the first diffraction grating 21 on the reticle 2. The lines of the first diffraction grating 21 which extend perpendicular to the Y axis generate +1-order diffraction light 41A, 0-order diffraction light 41C, and −1-order diffraction light 41B. The +1-order diffraction light 41A, the 0-order diffraction light 41C, and the −1-order diffraction light 41B reach a spatial filter 9. As shown in FIG. 17, the spatial filter 9 has a pair of apertures 10 for the lines of the grating 21 which extend perpendicular to the Y axis, and a pair of apertures 10 for the lines of the grating 21 which extend perpendicular to the X axis. The spatial filter 9 blocks the 0-order diffraction light 41C, and ±1-order diffraction lights generated from the lines of the grating 21 which extend perpendicular to the X axis. Only the +1-order diffraction light 41A and the −1-order diffraction light 41B generated from the lines of the grating 21 which extend perpendicular to the Y axis are transmitted through the spatial filter 9 via the apertures 10. As a result, only the +1-order diffraction light 41A and the −1-order diffraction light 41B are incident to the projection lens 1. The +1-order diffraction light 41A and the −1-order diffraction light 41B are re-diffracted by the projection lens 1, forming interference fringes on the diffraction grating 31 of the reference reticle 11. The pitch of the interference fringes is equal to a half of the pitch of an original geometrical optics image, and the contrast of the interference fringes is equal to 1. Accordingly, in the case where the pitch of the second diffraction grating 31 is equal to a half of the pitch of the original geometrical optics image which is given by "$\beta \times P$" and where the lines of the second diffraction grating 31 are perpendicular to the direction along which the related apertures 10 are spaced, moire fringes result from the overlap or the superimposition between the interference fringes and the lines of the second diffraction grating 31. The aberration of the projection lens 1 related to the meridional direction can be estimated by quantitatively measuring a curvature in the moire fringes.

A description will be given hereinafter of the measurement of the projection lens 1 in the sagittal direction. The spatial filter 9 is moved to a position where the 0-order diffraction light 41C and the ±1-order diffraction lights 41A and 41B generated from the lines of the first diffraction grating 21 which extend perpendicular to the Y axis are blocked while only ±1-order diffraction lights generated from the lines of the first diffraction grating 21 which extend perpendicular to the X axis are transmitted. The reference reticle 11 is rotated via a stage 12 to a position where the lines of the second diffraction grating 31 are perpendicular to the X axis. In this case, moire fringes result similarly. The aberration of the projection lens 1 related to the sagittal direction can be estimated by quantitatively measuring a curvature in the moire fringes.

In order to measure the curvature in the moire fringes, it is preferable that the pitch of the second diffraction grating 31 equals $n \times \beta \times P$ or $1/n \times \beta \times P$ where "n" denotes an integer. For example, the pitch of the second diffraction grating 31 is 0.7 micrometers.

A description will be given hereinafter of the operation of the fourth embodiment which relates to a process of evaluating the aberration of a given region of the projection lens 1. The light emitted from the coherent light source 4 is applied to the reticle 2 via an illumination optical system including devices 5–7. The whole of the projection area 20 of the reticle 2 is illuminated by the coherent light. Thus, diffraction light is generated from the entire area of the first diffraction grating 21. The diffraction light is applied to the spatial filter 9. The spatial filter 9 is moved to a position where the light blocking part of the spatial filter 9 which extends between the apertures 10 is located directly below a specified one of the sub diffraction gratings 21a. The 0-order diffraction light 41C and the ±1-order diffraction lights generated from the lines of the first diffraction grating 21 which extend perpendicular to the X axis are blocked by the spatial filter 9 while only the ±1-order diffraction lights 41A and 41B generated from the lines of the first diffraction grating 21 which extend perpendicular to the Y axis are transmitted through the spatial filter 9. As a result, only the ±1-order diffraction light 41A and the −1-order diffraction light 41B are incident to the projection lens 1. The +1-order diffraction light 41A and the −1-order diffraction light 41B pass through the projection lens 1 while being re-diffracted by the projection lens 1. The +1-order diffraction light 41A and the −1-order diffraction light 41B which exit from the projection lens 1 interfere with each other, forming the interference fringes only on the part of the image plane of the projection lens 1 which corresponds to the specified one of the sub diffraction gratings 21a. The reference reticle 11 is moved via a stage 12 into a position where an image of the specified one of the sub diffraction gratings 21a can be normally formed through the projection lens 1. The moire fringes result from the overlap or the superimposition between the lines of the second diffraction grating 31 on the reference reticle 11 and the interference fringes by the +1-order diffraction light 41A and the −1-order diffraction light 41B which are generated by the specified one of the sub diffraction gratings 21a. Since the specified one of the sub diffraction gratings 21a corresponds to a portion of the projection lens 1, the aberration of this portion of the projection lens 1 can be evaluated by observing the moire fringes. The moire fringes on the reference reticle 11 are moved to a central part of the observation field of view via an observation optical system including devices 14–17. The shape of the moire fringes is observed through the observation optical system. This observation enables the evaluation of the aberration of the projection lens 1 which relates to the meridional direction.

Next, the spatial filter 9 is moved to a position where the 0-order diffraction light 41C and the ±1-order diffraction lights 41A and 41B generated from the lines of the first diffraction grating 21 which extend perpendicular to the Y axis are blocked while only the ±1-order diffraction lights generated from the lines of the first diffraction grating 21 which extend perpendicular to the X axis are transmitted. This movement of the spatial filter 9 causes a 90-degree rotation of the direction of the interference fringes formed on the reference reticle. The reference reticle 11 is rotated so that the direction of the lines of the second diffraction grating 31 is changed by an angle of 90 degrees. In this case, moire fringes result similarly. The shape of the moire fringes is observed through the observation optical system. This observation enables the evaluation of the aberration of the projection lens 1 which relates to the sagittal direction. As a result, it is possible to evaluate the aberration of the projection lens 1 which results from the difference between the curvatures of the projection lens 1 in the meridional direction and the sagittal direction.

What is claimed is:

1. An apparatus for evaluating a lens, comprising:
    a first reticle located at an object position of the lens and formed with a first diffraction grating;
    a stage supporting the first reticle;
    a coherent light source illuminating a whole region of the first diffraction grating;
    a spatial filter blocking a 0-order component of diffraction light from the first diffraction grating;
    a second reticle located at an image position of the lens and formed with a second diffraction grating;
    a stage moving the second reticle within a projection range of the lens; and
    means for observing moire fringes which are caused by the second diffraction grating and interference fringes, the interference fringes being formed on the second reticle by re-diffraction by the lens.

2. The apparatus of claim 1 wherein the spatial filter is detachably located on a spectrum plane within the lens.

3. The apparatus of claim 1 wherein the first diffraction grating comprises a plurality of sub diffraction gratings.

4. The apparatus of claim 1 wherein the first diffraction grating comprises a plurality of sub diffraction gratings, and the spatial filter is disposed between the first reticle and the lens, and further comprising means for moving the spatial filter in a horizontal plane.

5. The apparatus of claim 1 wherein the first diffraction grating comprises a plurality of sub diffraction gratings, and each of the sub diffraction gratings comprises a set of first parallel straight lines and a set of second parallel straight lines which are perpendicular to the first lines, and wherein the spatial filter selects and transmits ±1-order components of diffraction light generated from one of a set of the first lines and a set of the second lines of the sub diffraction gratings, and the spatial filter is disposed between the first reticle and the lens, and further comprising means for moving the spatial filter in a horizontal plane.

6. The apparatus of claim 1 wherein the first diffraction grating comprises parallel straight lines spaced at equal pitches P, and $P \geq \lambda/NA$ where "NA" denotes a numerical aperture of the lens and "$\lambda$" denotes a wavelength of used light of the lens.

7. The apparatus of claim 1 wherein the first diffraction grating comprises parallel straight lines spaced at equal pitches P, and the second diffraction grating comprises parallel straight lines spaced at equal pitches p, and wherein $p = n \cdot \beta \cdot P$ where "n" denotes a predetermined integer and "$\beta$" denotes a magnification of the lens.

8. The apparatus of claim 1 wherein the first diffraction grating comprises parallel straight lines spaced at equal pitches P, and the second diffraction grating comprises parallel straight lines spaced at equal pitches p, and wherein $p = 1/n \cdot \beta \cdot P$ where "n" denotes a predetermined integer and "$\beta$" denotes a magnification of the lens.

9. An apparatus for evaluating a lens, comprising:
    a different grating located at an object plane of the lens;
    means for illuminating the diffraction grating with coherent light, wherein the diffraction grating generates diffraction light from the coherent light, and the diffraction light is incident to the lens;
    means for removing an 0-order component from the diffraction light;

a member located at an image plane of the lens and having a predetermined pattern, wherein the diffraction light passes through the lens and forms interference fringes on the member, and wherein moire fringes result from an overlap between the interference fringes and the predetermined pattern; and means for enabling the moire fringes to be observed.

* * * * *